United States Patent
Yu et al.

(10) Patent No.: US 10,212,818 B2
(45) Date of Patent: Feb. 19, 2019

(54) METHODS AND APPARATUS FOR A SUBSTRATE CORE LAYER

(71) Applicant: Futurewei Technologies, Inc., Plano, TX (US)

(72) Inventors: Fei Yu, Wuhan (CN); Anwar A. Mohammed, San Jose, CA (US); Rui Niu, Beijing (CN)

(73) Assignee: FUTUREWEI TECHNOLOGIES, INC., Plano, TX (US)

( * ) Notice: Subject to any disclaimer, the term of this patent is extended or adjusted under 35 U.S.C. 154(b) by 0 days.

(21) Appl. No.: 16/001,416

(22) Filed: Jun. 6, 2018

(65) Prior Publication Data

US 2018/0288880 A1 Oct. 4, 2018

Related U.S. Application Data

(62) Division of application No. 13/355,128, filed on Jan. 20, 2012.

(51) Int. Cl.
*H05K 1/03* (2006.01)
*H05K 1/18* (2006.01)
(Continued)

(52) U.S. Cl.
CPC ....... *H05K 1/186* (2013.01); *H01L 23/49827* (2013.01); *H01L 23/5389* (2013.01);
(Continued)

(58) Field of Classification Search
CPC ..... H05K 1/186; H05K 3/4007; H05K 3/3436
See application file for complete search history.

(56) References Cited

U.S. PATENT DOCUMENTS

| 8,779,583 B2 * | 7/2014 | Pressel | H01L 25/50 |
| | | | 257/684 |
| 2004/0107569 A1 * | 6/2004 | Guzek | H01L 23/142 |
| | | | 29/846 |

(Continued)

FOREIGN PATENT DOCUMENTS

| CN | 1720617 A | 1/2006 |
| CN | 101325188 A | 12/2008 |

(Continued)

OTHER PUBLICATIONS

Ramm, P. et al., "3D System Integration Technologies," Materials Research Society Symposium Proc., vol. 766, 2003, pp. E5.6.1-E5.6.12.

(Continued)

*Primary Examiner* — Timothy J Thompson
*Assistant Examiner* — Rhadames Alonzo Miller
(74) *Attorney, Agent, or Firm* — Slater Matsil, LLP

(57) ABSTRACT

A structure for a core layer of a substrate and a method for fabricating a core layer of a substrate are disclosed. The core layer comprises a molding compound encapsulating a die or a plurality of dies, a dielectric layer on the surfaces of the molding compound, and a conductive layer on top of the dielectric layer. A through hole is formed through the dielectric layer and the molding compound, which may be filled with a metal plate. A laser via is formed similarly. Build-up layers may be assembled next to the core layer to form the substrate, which can be used to package dies.

20 Claims, 9 Drawing Sheets

(51) Int. Cl.
  *H05K 3/34* (2006.01)
  *H05K 3/40* (2006.01)
  *H01L 23/00* (2006.01)
  *H01L 23/498* (2006.01)
  *H01L 23/538* (2006.01)
  *H01L 21/56* (2006.01)
  *H01L 23/31* (2006.01)

(52) U.S. Cl.
  CPC .............. *H01L 24/19* (2013.01); *H01L 24/96* (2013.01); *H01L 21/568* (2013.01); *H01L 23/3128* (2013.01); *H01L 2224/04105* (2013.01); *H01L 2224/16235* (2013.01); *H01L 2224/32225* (2013.01); *H01L 2224/73204* (2013.01); *H01L 2224/92125* (2013.01); *H01L 2924/12042* (2013.01); *H01L 2924/15311* (2013.01); *H01L 2924/181* (2013.01); *H05K 1/036* (2013.01); *H05K 3/3436* (2013.01); *H05K 3/4007* (2013.01); *H05K 2201/09118* (2013.01); *Y10T 29/49124* (2015.01)

(56) References Cited

U.S. PATENT DOCUMENTS

| | | | | |
|---|---|---|---|---|
| 2005/0001331 A1* | 1/2005 | Kojima | ............... | H01L 23/3121 257/778 |
| 2007/0069353 A1* | 3/2007 | Beer | ............... | H01L 23/29 257/678 |
| 2008/0136009 A1* | 6/2008 | Theuss | ............... | B81B 7/007 257/690 |
| 2008/0237828 A1* | 10/2008 | Yang | ............... | H01L 21/6835 257/690 |
| 2008/0237879 A1* | 10/2008 | Yang | ............... | H01L 23/5389 257/774 |
| 2009/0155956 A1* | 6/2009 | Pohl | ............... | H01L 21/568 438/109 |
| 2010/0019370 A1* | 1/2010 | Pressel | ............... | B81B 7/02 257/690 |
| 2010/0053920 A1* | 3/2010 | Zeng | ............... | H01L 21/486 361/764 |
| 2010/0133682 A1* | 6/2010 | Meyer | ............... | H01L 21/568 257/698 |
| 2010/0314352 A1* | 12/2010 | Chen | ............... | H01L 21/6835 216/13 |
| 2011/0001247 A1* | 1/2011 | Jobetto | ............... | H01L 21/486 257/774 |
| 2011/0221054 A1* | 9/2011 | Lin | ............... | H01L 21/568 257/692 |

FOREIGN PATENT DOCUMENTS

| | | |
|---|---|---|
| DE | 102006001429 A1 | 3/2007 |
| EP | 2515329 A1 | 10/2012 |
| JP | 2005209933 | 8/2005 |
| JP | 2008258621 A | 10/2008 |
| JP | 2011029602 A | 2/2011 |
| JP | 2011211242 A | 10/2011 |

OTHER PUBLICATIONS

Braun, T., et al., "Through Mold Vias for Stacking of Mold Embedded Packages," Electronic Components and Technology Conference, IEEE Std. 978, 2011, pp. 48-54.

"Copper (Cu) Wire Bonding," Amkor Technology retrieved from www.amkor.com, Jan. 20, 2012, 2 pages.

* cited by examiner

METHODS AND APPARATUS FOR A SUBSTRATE CORE LAYER

CROSS-REFERENCE TO RELATED APPLICATIONS

This application is a Divisional of U.S. patent application Ser. No. 13/355,128, filed on Jan. 20, 2012, which application is hereby incorporated herein by reference.

TECHNICAL FIELD

The present invention relates to substrate manufacturing, and in particular embodiments, to systems and methods for substrate manufacturing used in various packaging technologies.

BACKGROUND

Since the invention of the integrated circuit (IC), the semiconductor industry has experienced rapid growth due to continuous improvements in the integration density of a variety of electronic components. For the most part, this improvement in integration density has come from repeated reductions in minimum feature size, which allows more components to be integrated into a given area. As the demand for even smaller electronic devices has grown, there has grown a need for smaller and more creative packaging techniques of semiconductor dies.

Two types of packaging techniques for die assembly are used. The older and mature technique is wire bonding (WB) where the die is back bonded and wires connect from the top (face) of the die to the substrate. The newer technique is flip chip (FC) bonding, where the chip is bonded face down on the substrate and the interconnection is accomplished with a small solder ball or bump.

There is an increased awareness in the semiconductor industry that assembly and packaging is an essential and integral part of the semiconductor product. Packaging techniques have become a critical competitive factor in many market segments, since it affects operating frequency, power, reliability, and cost. As a result of rapidly emerging technologies and applications, the boundaries between semiconductor, packaging, and system technologies are no longer clear; they must all be considered concurrently in a system-level approach in order to optimize the substrate design and package techniques.

Substrates have become the most expensive element of electronic packages while at the same time limiting package performance. Ceramic, multi-layer substrates have always been very expensive but they allow for a great deal of design freedom e.g. integration of passives. The drawbacks are a high dielectric constant and a very low coefficient of thermal expansion (CTE) as compared to printed circuit boards (PCB) but closely matched to the silicon die. On the other hand, organic substrates have a CTE which is matched to PCBs but is significantly larger than that of the silicon die. Organic substrates were originally introduced to significantly reduce the cost of packaging by taking advantage of low cost PCB manufacturing technology, materials and scale. Organic substrates can be subdivided further, such as laminate substrates used for plastic ball grid array (PBGA), or build-up substrates typically used for Flip Chip die (FCBGA). Sequential build-up (SBU) laminate substrate technology is now the technology of choice for high density, high-performance silicon packaging. For example, SBU technology was selected by Intel for flip-chip packaging.

PBGA substrates come in a few simple configurations: two layers (2L), four layers (4L) and six layers (6L) of circuitry which are interconnected by plated through holes (PTH). An SBU laminate substrate is composed of three distinct technology elements: the surface finish for soldering and adhesion, build-up layers that contain most of the wiring, and a core layer, which provides mechanical strength. How to optimize the core layer design of a substrate for efficient packaging is a problem.

SUMMARY

Structures and methods for substrate manufacturing used in various packaging technologies are disclosed. One or more dies are molded into molding compound to act as a core layer which replaces the normal core layer consisting of dielectric layers of a substrate used in packaging of chips. The technique reduces the height of the core layer and shortens the interconnection between chips to achieve high density with lower cost, in addition to better thermal management.

In accordance with an embodiment, a structure for a core layer of a substrate is disclosed. The structure comprises a first die with a die pad, a molding compound encapsulating the first die while leaving an outer surface of the die pad uncovered by the molding compound. A first dielectric layer is further formed on one surface of the molding compound and a second dielectric layer on another surface of the molding compound. A first conductive layer is then formed on top of the first dielectric layer and a second conductive layer on top of the second dielectric layer. A hole is formed through the first dielectric layer, the second dielectric layer, and the molding compound. The hole may be filled with a metal plate. A laser via may be formed through the first dielectric layer and connected to the die pad. The laser via may be connected to the metal plate by way of the first conductive layer.

In accordance with an embodiment, a structure for a core layer of a substrate is disclosed. A build-up layer may be formed on one side of the structure for the core layer to form a substrate. Another build up layer on another side of the structure for the core layer to form the substrate. An additional die may be connected to the laser via of the structure of the core layer by way of a connection device. An additional die may be connected to the metal plate by way of a connection device.

In accordance with an embodiment, the structure for a core layer of a substrate may further comprise a plurality of die pads for the first die, and a plurality of laser vias through the first conductive layer and the first dielectric layer connected to the plurality of die pads. The structure for a core layer of a substrate may further comprise a plurality of holes through the first dielectric layer, the second dielectric layer, and the molding compound, which are filled with a plurality of metal plates.

In accordance with an embodiment, the structure for a core layer of a substrate may further comprise a second die with a die pad, where the molding compound encapsulates the second die separated from the first die. A second laser via through the first conductive layer and the first dielectric layer is connected to the die pad of the second die.

In accordance with an embodiment, the structure for a core layer of a substrate may have the first dielectric layer made of Ajinomoto Build-up Film (ABF), Benzocyclobuthene (BCB), or other similar material. The first conductive layer with the first dielectric layer and the second conductive layer with the second dielectric layer may comprise of resin coated copper (RCC) or other similar material. The first conductive layer may comprise a plurality of conductive sub-layers and the second conductive layer may comprise a plurality of conductive sub-layers. The plurality of conductive sub-layers of the first conductive layer and the plurality of conductive sub-layers of the second conductive layer may be formed at different times.

In accordance with an example embodiment, a method for fabricating a core layer of a substrate is provided. The method places a first die with a die pad on top of a peelable tape covering a base while the die pad is in contact with the tape. A second die with a die pad may be similarly placed. The method then encapsulates the first die and the die pad using a molding compound, after which the base and the peelable tape may be removed. The second die may be similarly encapsulated. The method then forms a first dielectric layer on one surface of the molding compound and a second dielectric layer on another surface of the molding compound, and forms a first conductive layer on top of the first dielectric layer and a second conductive layer on top of the second dielectric layer. The method further forms a hole through the first conductive layer, the second conductive layer, the first dielectric layer, the second dielectric layer, and the molding compound. A laser via may be similarly formed through the first conductive layer and the first dielectric layer connected to the die pad of the encapsulated dies. The method then plates the hole and laser via with a metal plate. The method further attaches a first photo resist film covering the metal plate, the laser via, and the first conductive layer, and attaches a second photo resist film covering the metal plate and the second conductive layer. A pattern is formed by etching the first conductive layer on areas not protected by the first resist film, and etching the second conductive layer on areas not protected by the second resist film. Finally, the first resist film and the second resist film are removed.

In accordance with an example embodiment, a method for fabricating a core layer of a substrate is provided. A build-up layer may be assembled to cover the metal plate, the first conductive layer, and the laser via of the core layer. Another build-up layer may be assembled to cover the metal plate and the second conductive layer.

In accordance with an example embodiment, a method for fabricating a core layer of a substrate is provided. The method comprises placing a first die with a die pad on top of a peelable tape covering a base while the die pad is in contact with the tape, forming a molding compound on top of the peelable tape and on top of the first die which encapsulates the first die, removing the base and the peelable tape, forming a first dielectric layer on one surface of the molding compound and a second dielectric layer on another surface of the molding compound, forming a through hole through the first dielectric layer, the second dielectric layer, and the molding compound, drilling a via through the first dielectric layer connected to the die pad of the first die, electroless plating a first conductive layer over the first dielectric layer, the second dielectric layer, the through hole, and the via, attaching a resist film covering the electroless plated first conductive layer, patterning and exposing the resist film to form a pattern, plating a second conductive layer over the through hole, the via, and over the first conductive layer which are over the first dielectric layer and the second dielectric layer based on the pattern of the resist film, removing the resist film, and etching the first conductive layer and the second conductive layer to remove the first conductive layer on places where only the first conductive layer is plated.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the embodiments of the present disclosure are discussed in details below. It should be appreciated, however, that the embodiments of the present disclosure provide many applicable concepts that can be embodied in a wide variety of specific contexts. The specific embodiments discussed are merely illustrative of specific ways to make and use the disclosure, and do not limit the scope of the disclosure.

As will be more fully explained below, structures and methods for substrate manufacturing used in various packaging technologies will be disclosed. One or more dies are molded into molding compound to act as a core layer which replaces the normal core layer consisting of dielectric layers of a substrate used in packaging of chips. The technique reduces the height of the core layer and shortens the interconnection between chips to achieve high density with lower cost, in addition to better thermal management.

Figure 1A:
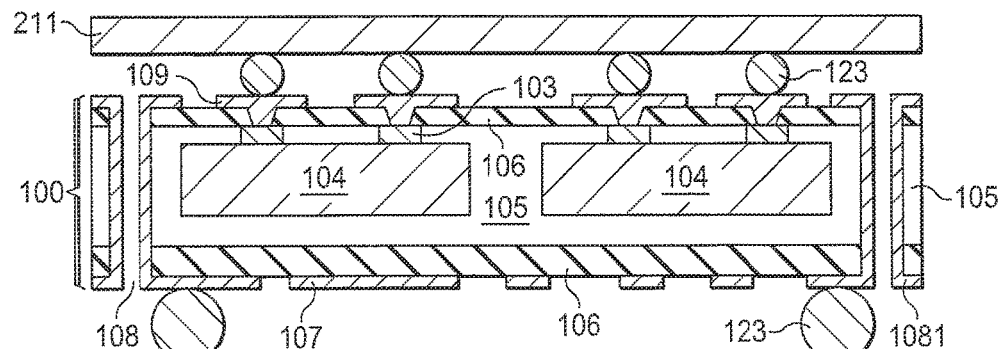
FIGS. 1(a)-1(c) illustrate various package structures comprising a substrate with one or more dies embedded in the core layer of the substrates.
Figure 1B:
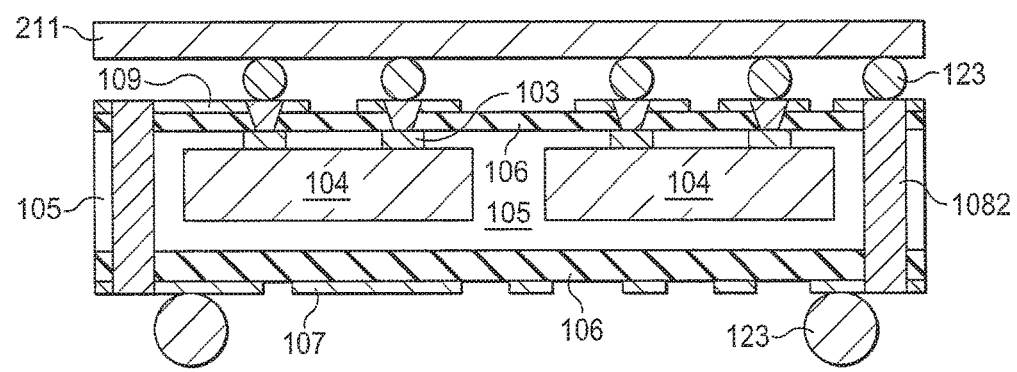

FIG. 1(a) illustrates a structure 100 for a core layer of a substrate. It comprises a first die 104 with a die pad 103, and a molding compound 105 encapsulates the first die 104 while leaving an outer surface of the die pad 103 uncovered by the molding compound, which is in contact with other connection devices such as a via 109. It further comprises a first dielectric layer 106 on one surface of the molding compound and a second dielectric layer 106 on another surface of the molding compound. A first conductive layer 107 lies on top of the first dielectric layer 106 and a second conductive layer 107 on top of the second dielectric layer 106, on two sides of the molding compound 105. A hole 108 through the first dielectric layer 106, the second dielectric layer 106, and the molding compound 105 is plated or filled with metal 1081 as shown in FIG. 1(a) or metal plate 1082 as shown in FIG. 1(b), where FIG. 1(b) has all other parts the same as shown in FIG. 1(a). The description below works for either the hole 108 filled with a metal fill 1081 or plated as a metal plate 1082. Either the metal fill 1081 or the metal plate 1082 may be used in the following descriptions, which generally work for both cases.

A laser via 109 is formed through the first dielectric layer 106 and connected to the die pad 103. There may be more than one vias 109 formed on the structure 100. The metal fill 1081, the first conductive layer 107, and the laser via 109 give the structure 100 a generally flat outer surface. An additional die 211 connected to the laser vias 109 through a plurality of solder balls 123. The structure 100 may connect to the die 211 by the metal fill 1081 in FIG. 1(a) or the metal plate in FIG. 1(b), by way of a connection device such as a solder ball 123. Additional solder ball 123 may be used to connect the structure 100 to a printed circuit board (not shown) at the opposite side of the die 211.

Figure 1C:
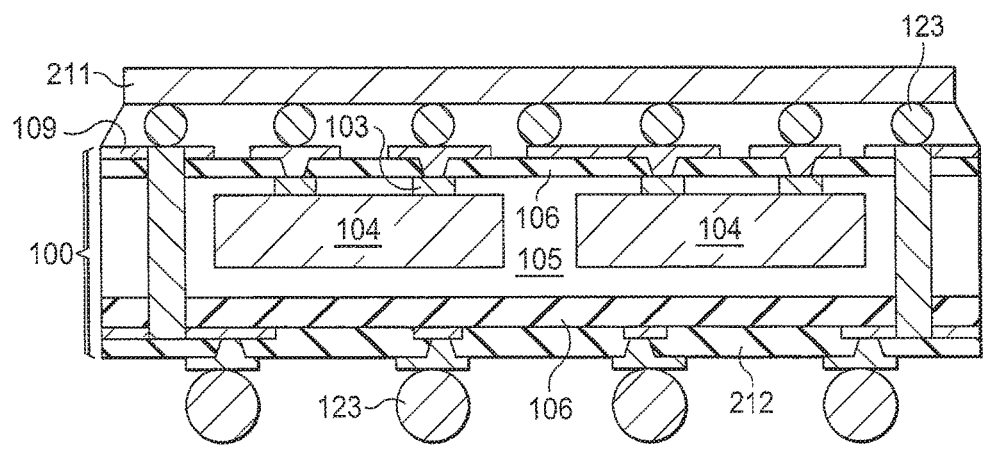

Furthermore, the structure 100, acting as the core layer of the substrate, may be further connected a build up layer 212 as shown in FIG. 1(c), where FIG. 1(c) has all other parts the same as shown in FIG. 1(b). FIG. 1(c) shows only a build-up layer on one side of the structure to form the substrate. Another build up layer may be formed on another side of the structure to form the substrate (not shown).

The structure 100 of the core layer of a substrate shown in FIGS. 1(a)-1(c) are only for illustration purposes and are not limiting. There may be various other configurations performing the same function as the ones shown in FIGS. 1(a)-1(c). The structure 100 may be simply referred as the core layer of a substrate, or a core layer as well in the following descriptions.

The first conductive layer 107 and the second conductive layer 107 may be formed on the two sides of the molding compound 105. They may comprise a plurality of conductive pieces on the same layer where one conductive piece is disconnected from another. The first conductive layer 107 may comprise a plurality of conductive sub-layers and the second conductive layer comprise of a plurality of conductive sub-layers. The plurality of conductive sub-layers of the first conductive layer and the plurality of conductive sub-layers of the second conductive layer may be formed at different times.

The material of the conductive layer 107 is not limited. Preferably, the material of the conductive layer is selected from the group consisting of copper, tin, nickel, chromium, titanium, a copper/chromium alloy, and a tin/lead alloy. The process for forming the conductive layer 107 is not limited. Preferably, the process is sputtering or electroless plating.

The process for forming the vias 109 of the dielectric layer 106 is not limited. Preferably, the process is laser-ablation, or exposure and development. The laser via 109 may be connected to the metal fill 1081 by way of the first conductive layer 107.

There may be more than one die pad 103 for the first die 104, and more than one laser via 109 through the first dielectric layer 106 connected to the plurality of die pads 103. An outer surface of the metal fill 1081, an outer surface of the first conductive layer 107, and an outer surface of the plurality of laser vias 109 give the structure 100 a flat outer surface.

There may be more than one hole 108 through the first dielectric layer 106, the second dielectric layer 106, and the molding compound 105, which are filled with a plurality of metal fills 1081, wherein outer surfaces of the plurality of metal fill 1081 and an outer surface of the first conductive layer 107 give the structure 100 a flat outer surface.

There may be more than one dies 104 each with a die pad 103, where the molding compound 105 encapsulates the second die apart from the first die while leaving an outer surface of the die pad of the second die uncovered by the molding compound, as shown in FIG. 1(a). A second laser via 109 may be formed through the first dielectric layer 106 and connected to the die pad 103 of the second die 104.

The first dielectric layer 106 may be formed a non-photosensitive organic resin, a photosensitive organic resin, such as Ajinomoto Build-up Film (ABF), Benzocyclobuthene (BCB), Liquid Crystal Polymer (LCP), Poly-imide (PI), Bismaleimide Triazine (BT), Aramide, or other similar materials, and a mixture of epoxy resin and fiber glass.

The first conductive layer 107 with the first dielectric layer 106 may be resin coated copper (RCC) or other similar material. The second conductive layer 107 with the second dielectric layer 106 may also be RCC or other similar material.

The buildup layer 212 shown in FIG. 1(c) may be a build up layer of a PBGA substrate. A PBGA substrate comes in a few simple configurations: two layers (2L), four layers (4L) and six layers (6L) of circuitry which are interconnected by plated through holes (PTH). Recently blind holes or vias are also used as interconnects to form substrates with 2L, 1+2+1, 2+2+2 and 1+4+1 layers.

The structure 100, which acts as a core layer, and the buildup layer 212 shown in FIG. 1(c) may be for an SBU laminate substrate. An SBU laminate substrate may be composed of three distinct technology elements: the surface finish for soldering and adhesion, build-up layers that contain most of the wiring, and a core, which provides mechanical strength. Build-up layers are characterized by copper trace dimensions such as width, thickness, and spacing. Almost all signal wiring in SBU occurs in build-up layers.

FIGS. 2(a)-2(l) illustrate an example process of manufacturing a structure 100 of a core layer of a substrate with one or more dies 104 embedded in the core layer.

Figure 2A:
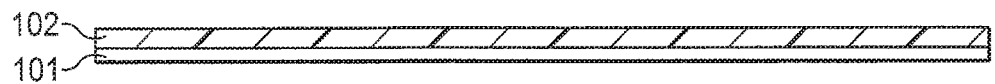
FIGS. 2(a)-2(l) illustrate a process of manufacturing a substrate with one or more dies embedded in the core layer.
Figure 2B:
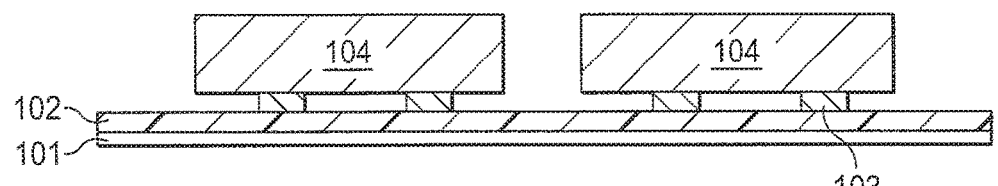

The method starts at the first step as illustrated in FIG. 2(a), where a peelable tape 102 is placed on top of a base 101 covering the base 101. In FIG. 2(b), a first die 104 with a die pad 103 is placed on top of the peelable tape 102 while the die pad 103 is in contact with the tape 102. A second die with a die pad may be placed on top of the peelable tape 102 as well while the die pad of the second die is in contact with the tape 102. The number is only for illustration purpose only and there may be more than one or two dies placed on the peelable tape 102.

Figure 2C:
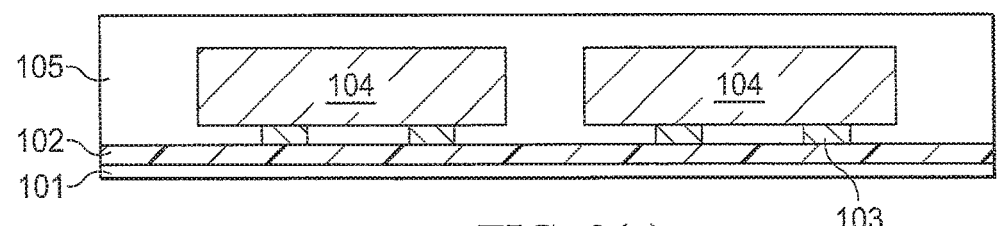

In FIG. 2(c), a molding compound 105 is formed on top of the peelable tape 102 and on top of the first die 104 which encapsulates the first die 104, while leaving the die pad 103 in direct contact with the peelable tape 102. If there are two dies as illustrated in FIG. 2(c), the first die and the second die may be both encapsulated within the molding compound 105, while the first die and the second die may be separated by the molding compound 105.

The descriptions below are for one example die 104 embedded in the molding compound 105. However, the procedures can be carried out similarly for multiple embedded dies within the molding compound 105.

Figure 2D:
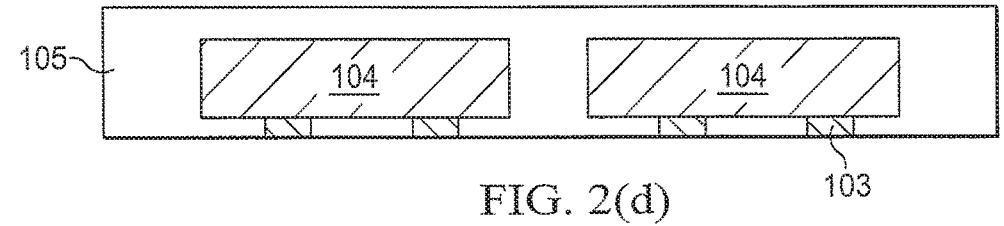
Figure 2E:
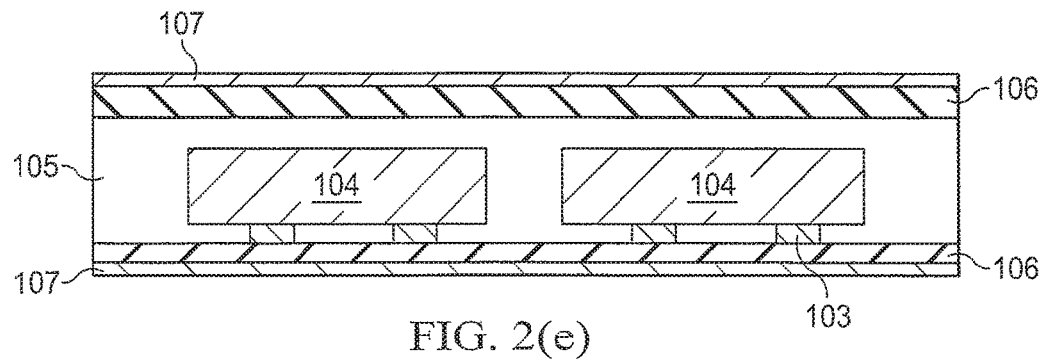

In FIG. 2(d), the peelable tape 102 and the base 101 are removed, so that the molding compound 105 surface and the die pad 103 surface form a flat surface which was connected to the tape surface. In FIG. 2(e), a first dielectric layer 106 is formed on one surface of the molding compound 105 and a second dielectric layer 106 is formed on another surface of the molding compound 105. A first conductive layer 107 is formed on top of the first dielectric layer 106 and a second metal layer 107 on top of the second dielectric layer 106. The first conductive layer 107 with the first dielectric layer 106 may be resin coated copper (RCC) or other similar material. The second conductive layer 107 with the second dielectric layer 106 may be RCC or other similar material.

Figure 2F:
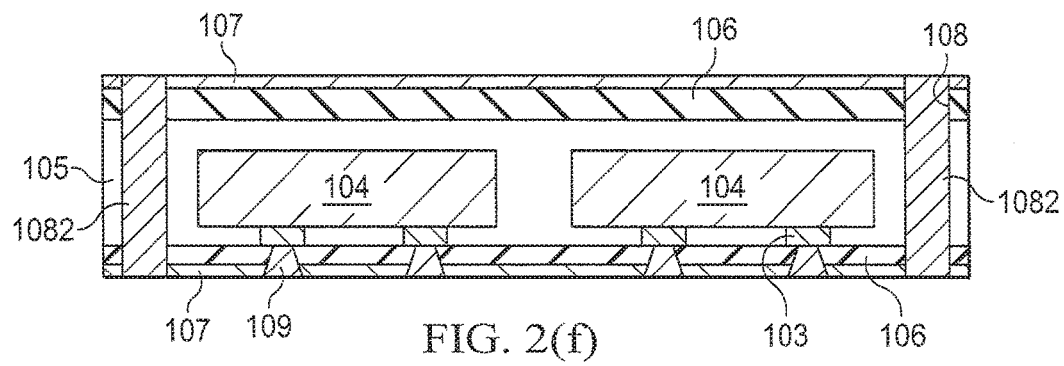

The method further proceeds to the next step as shown in FIG. 2(f), where a hole or a through hole 108 is drilled through the first dielectric layer 106, the molding compound 105, and the second dielectric layer 106. There may be a multiple holes drilled as well. If the first conductive layer 107 and the first dielectric layer 106 are formed together by RCC material, then the hole may be through the first conductive layer as well.

Next the drilled through hole 108 and laser via could be either plating a conductive layer on the surface of drill through hole, or plating conductive layer on the surface of drill through hole and then plug into filling material like resin, or plating conductive copper directly filling the drill through hole, to form a conductive metal plate 1082. Similarly, one or more laser via 109 are formed through the first dielectric layer connected to the die pad of the first die 104. If there are multiple dies embedded in the molding compound 105, a laser via through the first dielectric layer connected to the die pad of each of the die may be formed, wherein an outer surface of the metal plate 1082, an outer surface of the first conductive layer 107, and an outer surface of the laser via 109 form a flat surface as shown in FIG. 2(f).

Figure 2G:
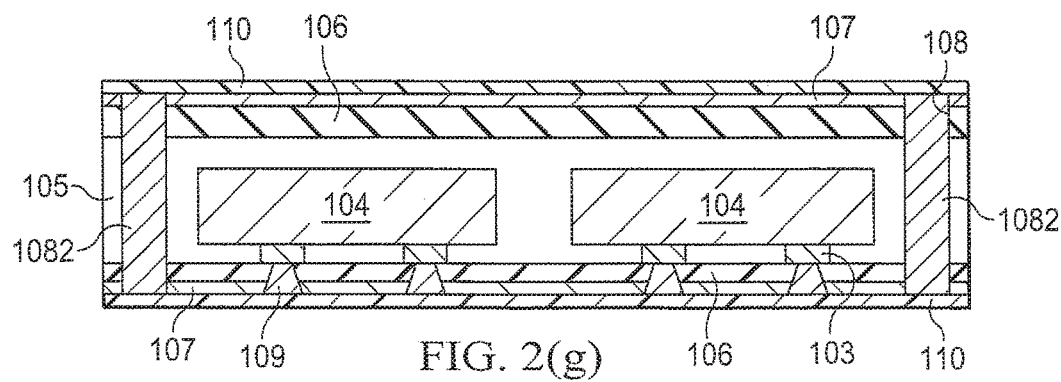
Figure 2H:
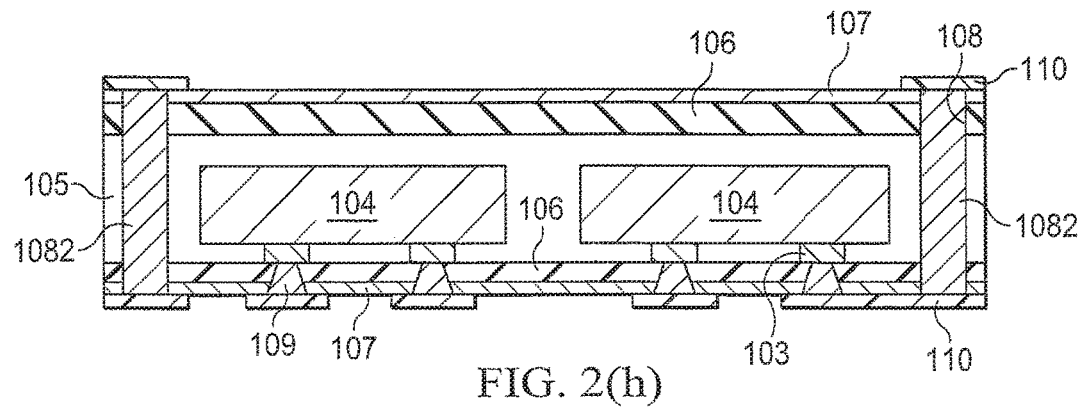
Figure 2I:
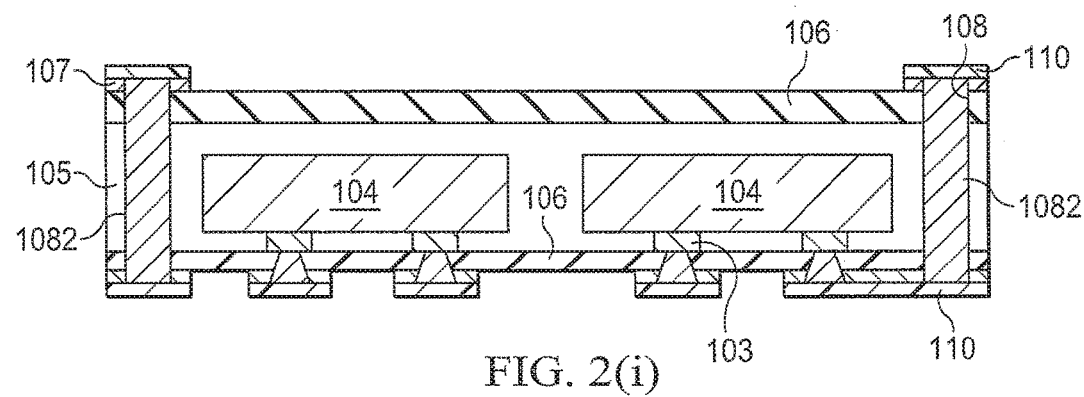
Figure 2J:
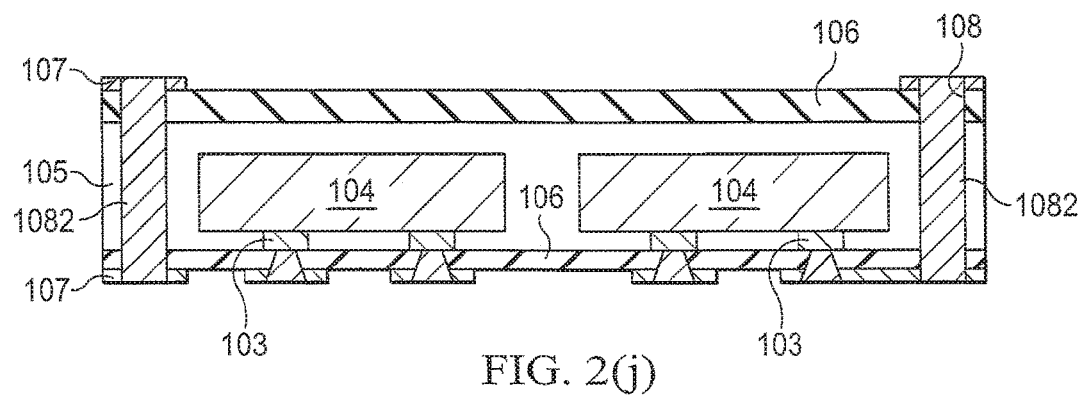

As illustrated in FIG. 2(g), a first photo resist film no is attached to the structure 100 covering the metal plate 1082, the laser via 109, and the first conductive layer 107. Similarly a second photo resist film no covering the metal plate 1082 and the second conductive layer 107 is attached. Illustrated in FIG. 2(h), the resist film no is patterned and exposed to etch the first conductive layer 107 on areas not protected by the first resist film no to form the structure shown in FIG. 2(i). Similar etching is done for the second conductive layer on areas not protected by the second resist film. FIG. 2(j) illustrates that the first resist film and the second resist film are removed.

Figure 2K:
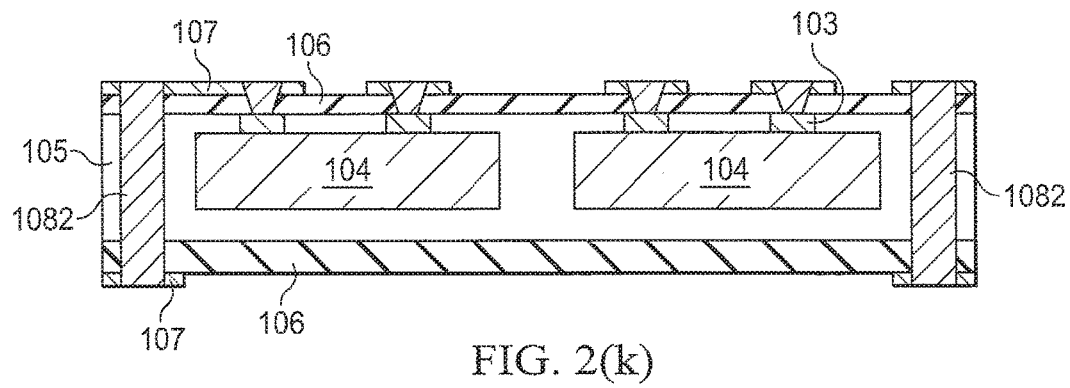
Figure 2L:
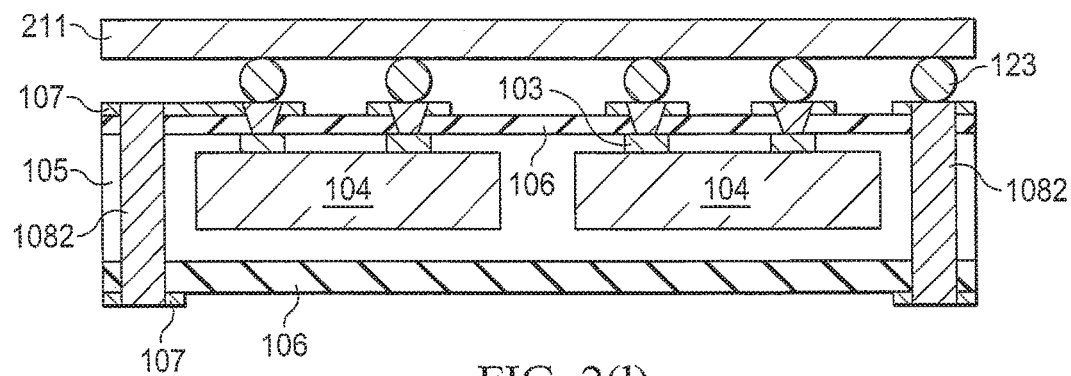

As illustrated in FIG. 2(k), the method then flips the structure to turn the side with via to the up direction so that other dies can be assembled. Illustrated in FIG. 2(l), an additional die 211 is connected to the laser via 109 by way of a connection device, which may be bumps or solder balls 123. There may be a plurality of bumps 123 connecting the vias 109 to the die 211. Additional connection device such as solder ball may be used to connect the metal plate to other die or other structures such as PCB, not shown. Not shown in the figures, additional structure such as buildup layers may be assembled. For example, a build-up layer may cover the metal plate 1082, the first conductive layer 107, and the laser via 109, or assembling another build-up layer covering another side of the structure and the metal fill and the second conductive layer.

FIGS. 3(a)-3(l) illustrate another example process of manufacturing a core layer of a substrate with one or more dies embedded in the core layer.

Figure 3A:
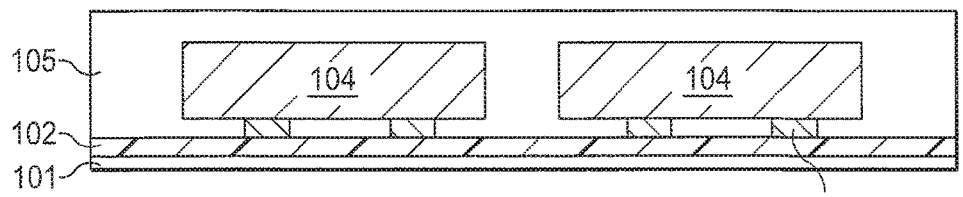
FIGS. 3(a)-3(l) illustrate another process of manufacturing a substrate with one or more dies embedded in the core layer.

The method starts at the first step as illustrated in FIG. 3(a), where a peelable tape 102 is placed on top of a base 101 covering the base 101, as previously illustrated in FIG. 2(a). A first die 104 with a die pad 103 is placed on top of the peelable tape 102 while the die pad 103 is in contact with the tape 102. A second die with a die pad may be placed on top of the peelable tape 102 as well while the die pad of the second die is in contact with the tape 102. The number is only for illustration purpose only and there may be more than one or two dies placed on the peelable tape 102. A molding compound 105 is formed on top of the peelable tape 102 and on top of the first die 104 which encapsulates the first die 104, while leaving the die pad 103 in direct contact with the surface of the peelable tape 102. If there are two dies as illustrated in FIG. 3(a), the first die and the second die may be both encapsulated within the molding compound 105, while the first die and the second die may be separated by the molding compound 105.

The descriptions below are for one example die 104 embedded in the molding compound 105. However, the procedures can be carried out similarly for multiple embedded dies within the molding compound 105.

Figure 3B:
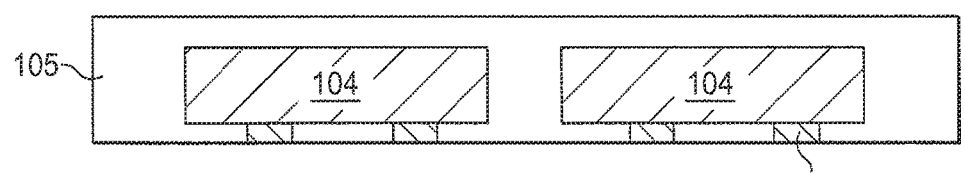

In FIG. 3(b), the peelable tape 102 and the base 101 are removed. As such, the molding compound 105 surface and the die pad 103 surface form a flat surface which was connected to the base surface.

Figure 3C:
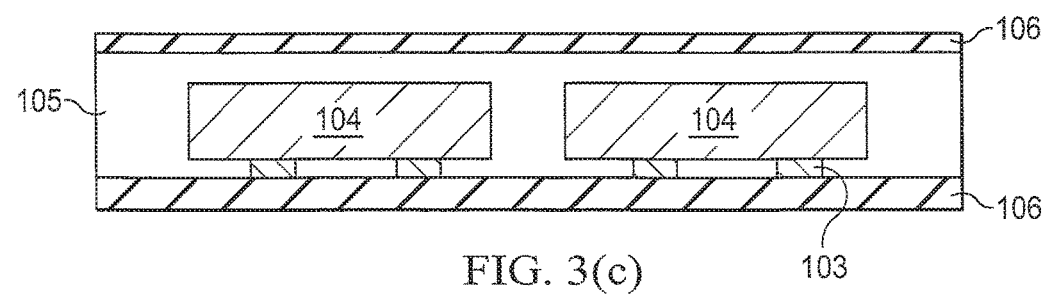

In FIG. 3(c), a first dielectric layer 106 on both surfaces of the molding compound 105 is formed. The first dielectric layer 106 may be formed of a non-photosensitive organic resin, a photosensitive organic resin, such as ABF, BCB, LCP, PI (Poly-imide), BT (Bismaleimide Triazine), or Aramide, and a mixture of epoxy resin and fiber glass, or some other similar materials.

Figure 3D:
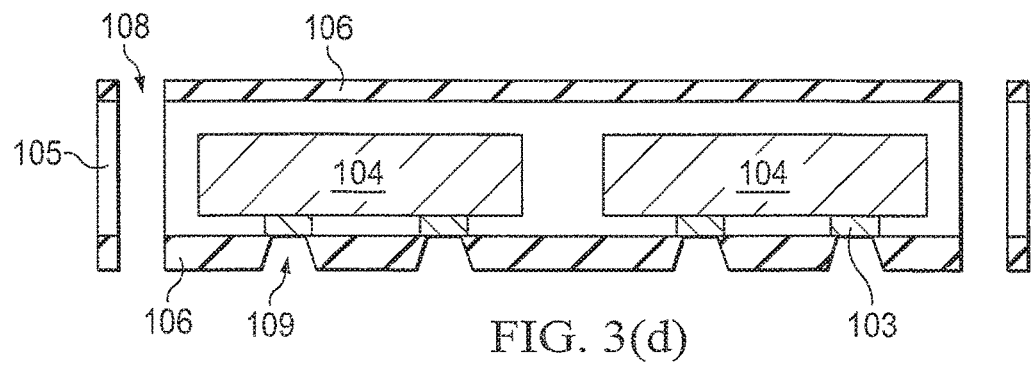

In FIG. 3(d), a through hole 108, which may be called as a hole, is drilled through the first dielectric layer 106, and the molding compound 105. Similarly, one or more laser via 109 is formed through the first dielectric layer connected to the die pad 103 of the first die 104. If there are multiple dies embedded in the molding compound 105, a laser via through the first dielectric layer connected to the die pad of each of the dies may be formed.

Figure 3E:
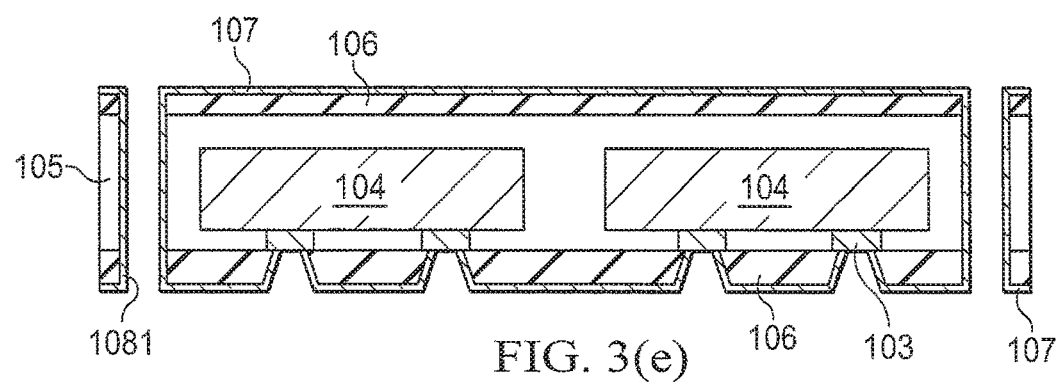

In FIG. 3(e), a first conductive layer 107 is electroless plated on top of the first dielectric layer 106, on top of the laser via 109, and on the surface of the through hole 108 to form the metal fill 1081. Components in FIGS. 3(e)-3(f) which are the same as shown in FIG. 3(d) are not marked explicitly anymore. However, it is easy to identify those components according to FIG. 3(d).

Figure 3F:
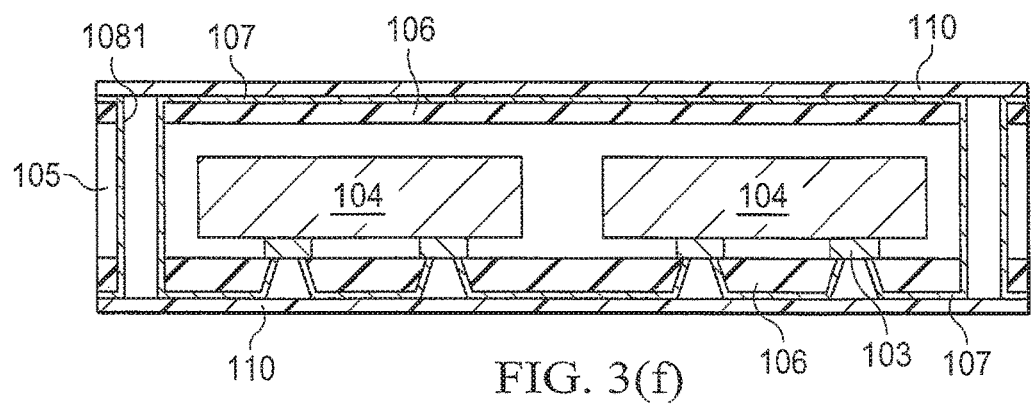

As illustrated in FIG. 3(f), a first photo resist film no is attached to the structure 100 to cover the surface of the through hole 108, the laser via 109, and the first conductive layer 107 on both sides of the structure.

Figure 3G:
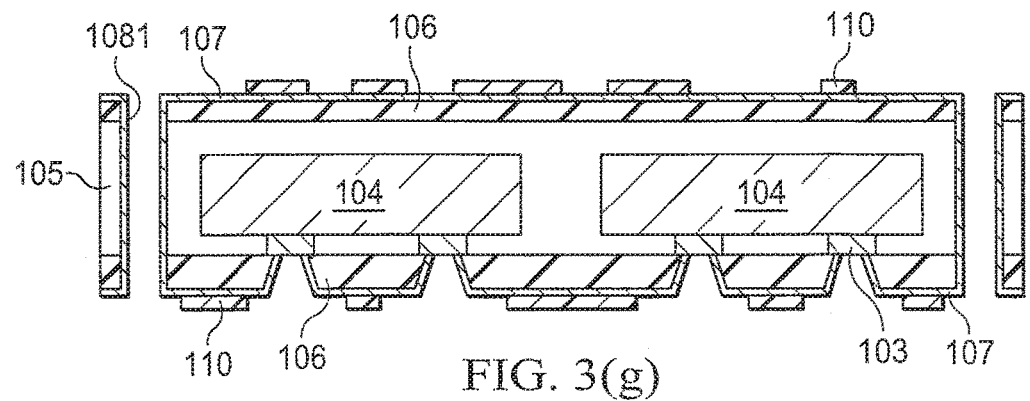
Figure 3H:
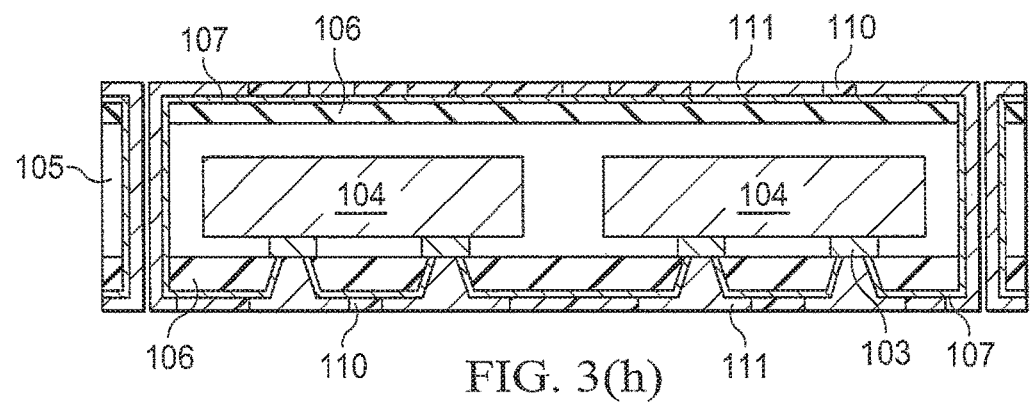

Illustrated in FIG. 3(g), the resist film no is patterned and exposed in certain areas. Illustrated in FIG. 3(h), a second conductive plating 111 may be performed on top of the first conductive layer, but not in the area covered by the resist film no.

Figure 3I:
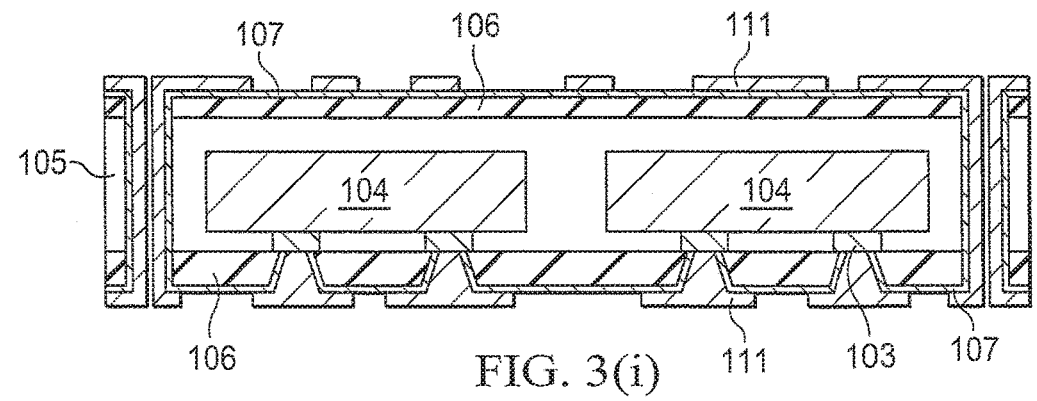

Illustrated in FIG. 3(i), patterned resist film no is removed after the second conductive plating layer 111 is performed.

Figure 3J:
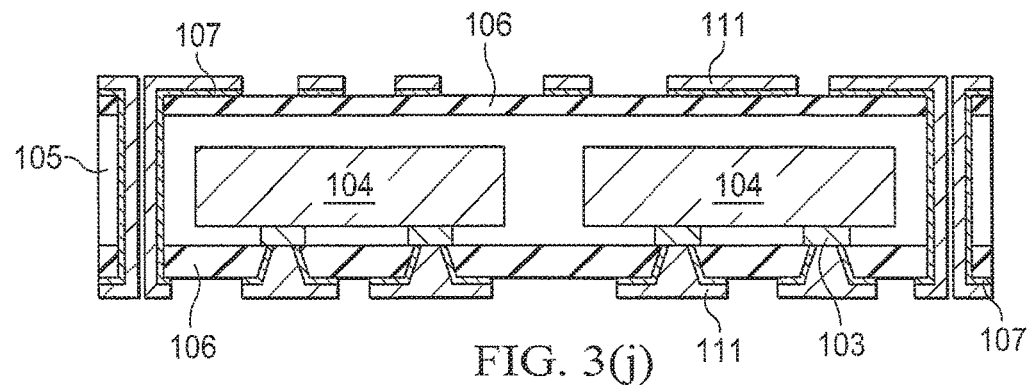

Illustrated in FIG. 3(j), fast etch is performed on the first conductive layer 107 and the second conductive layer 111 when the second conductive layer 111 covers up the first conductive layer 107, to remove the first metal layer 107 on places where only the first metal layer 107 was plated.

Figure 3K:
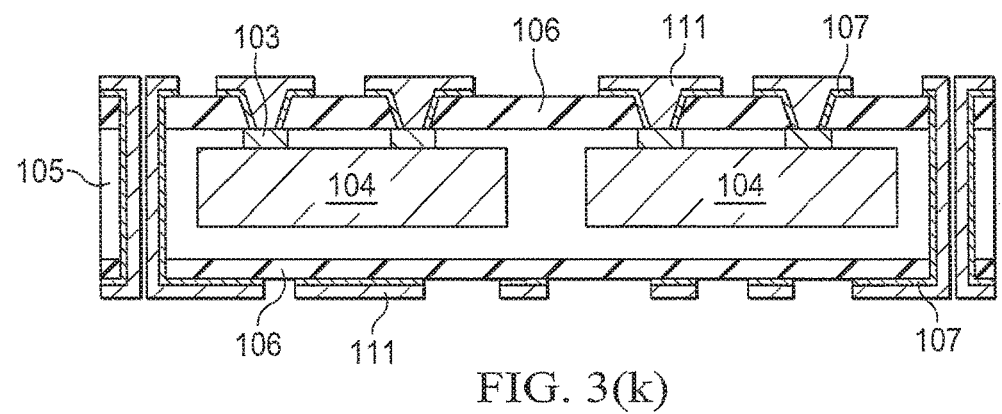

Illustrated in FIG. 3(k), other dies, packaged components could be assembled on either side of the substrate. An additional die can be assembled to one side of the substrate by bumping, wire bonding, etc. Other packaged components (like BGA, LGA, capacitor, resistor, etc.) could also be assembled on either side of the substrate. What's more, solder ball could be added in one side of the substrate, in order to connect to other substrate or PCB.

Figure 3L:
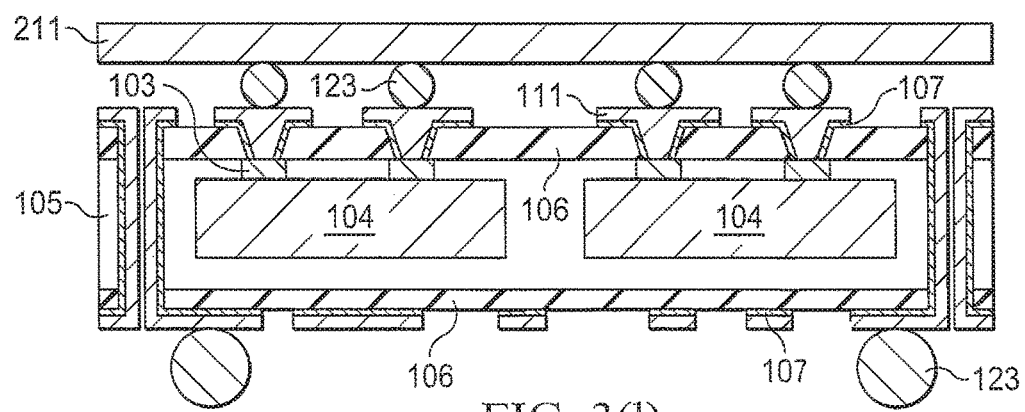

Illustrated in FIG. 3(l), an additional die 211 is connected to the laser via 109 by way of a connection device, which may be 123 bump. There may be a plurality of bumps 123 connecting the vias 109 to the die 211. Additional connection device such as solder ball 123 may be used to connect the metal fill to other die or other structures such as PCB. Not shown in the figures, additional structure such as buildup layers may be assembled. For example, a build-up layer may cover the metal fill 1081, the first conductive layer 107, and the laser via 109, or assembling another build-up layer covering another side of the structure and the metal fill and the second conductive layer.

Although the present disclosure and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the invention.

What is claimed is:

1. A method for fabricating a core layer of a substrate, comprising:
    placing a first die with a die pad on top of a peelable tape covering a base while the die pad is in contact with the peelable tape;
    encapsulating the first die and the die pad using a molding compound;
    removing the base and the peelable tape after the encapsulating;
    forming a first dielectric layer on one surface of the molding compound and a second dielectric layer on another surface of the molding compound after removing the base and the peelable tape;
    forming a first conductive layer on top of the first dielectric layer and a second conductive layer on top of the second dielectric layer;
    forming a through hole through the first conductive layer, the second conductive layer, the first dielectric layer, the second dielectric layer, and the molding compound after forming the first and second conductive layers;
    forming a laser via through the first conductive layer and the first dielectric layer connected to the die pad of the first die after forming the first and second conductive layers;
    plating the through hole and laser via with a metal plate, a flat surface being formed by an outer surface of the metal plate, an outer surface of the first conductive layer, and an outer surface of the laser via;
    attaching a first photo resist film covering the metal plate, the laser via, and the first conductive layer;
    attaching a second photo resist film covering the metal plate and the second conductive layer;
    etching the first conductive layer on areas not protected by the first photo resist film;
    etching the second conductive layer on areas not protected by the second photo resist film; and
    removing the first photo resist film and the second photo resist film.

2. The method of claim 1, further comprising assembling a build-up layer covering the metal plate, the first conductive layer, and the laser via.

3. The method of claim 1, further comprising assembling a build-up layer covering the metal plate and the second conductive layer.

4. The method of claim 1, further comprising:
    placing a second die with a die pad on top of the peelable tape covering the base while the die pad of the second die is in contact with the peelable tape;
    forming the molding compound on top of the peelable tape, the first die, and the second die, which encapsulates the first die and the second die while separating the first die and the second die by the molding compound; and
    forming a second laser via through the first conductive layer and the first dielectric layer connected to the die pad of the second die.

5. The method of claim 1, further comprising attaching the die pads of the first and second dies to respective bumps of a third die.

6. The method of claim 1, the first dielectric layer and the first conductive layer collectively, and the second dielectric layer and the second conductive layer collectively, each comprising resin coated copper.

7. A method for fabricating a core layer of a substrate, comprising:
    placing a first die with a die pad on top of a peelable tape covering a base while the die pad is in contact with the peelable tape;
    encapsulating the first die and the die pad using a molding compound;
    removing the base and the peelable tape;
    forming a first dielectric layer on one surface of the molding compound and a second dielectric layer on another surface of the molding compound opposite the one surface;
    forming a first conductive layer on top of the first dielectric layer and a second conductive layer on top of the second dielectric layer;
    forming a through hole through the first conductive layer, the second conductive layer, the first dielectric layer, the second dielectric layer, and the molding compound;
    forming a laser via through the first conductive layer and the first dielectric layer connected to the die pad of the first die; and
    plating the through hole and laser via with a metal conductor.

8. The method of claim 7, further comprising:
    attaching a first photo resist film covering the metal conductor, the laser via, and the first conductive layer;
    attaching a second photo resist film covering the metal conductor and the second conductive layer;
    etching the first conductive layer on areas not protected by the first photo resist film;
    etching the second conductive layer on areas not protected by the second photo resist film; and
    removing the first photo resist film and the second photo resist film.

9. The method of claim 8, further comprising assembling a build-up layer covering the metal conductor, the first conductive layer, and the laser via.

10. The method of claim 8, further comprising assembling a build-up layer covering the metal conductor and the second conductive layer.

11. The method of claim 8, further comprising:
    placing a second die with a die pad on top of the peelable tape covering the base while the die pad of the second die is in contact with the peelable tape;
    forming the molding compound on top of the peelable tape, the first die, and the second die, which encapsulates the first die and the second die while separating the first die and the second die by the molding compound; and
    forming a second laser via through the first conductive layer and the first dielectric layer connected to the die pad of the second die.

12. The method of claim 11, further comprising attaching the die pads of the first and second dies to respective bumps of a third die.

13. The method of claim 7, the first dielectric layer and the first conductive layer collectively, and the second dielectric layer and the second conductive layer collectively, each comprising resin coated copper.

14. A method for fabricating a core layer of a substrate, comprising:
    placing a first die with a die pad on top of a peelable tape covering a base while the die pad is in contact with the peelable tape;
    forming a molding compound on top of the peelable tape and on top of the first die to encapsulate the first die;
    removing the base and the peelable tape;
    forming a first dielectric layer on one surface of the molding compound and a second dielectric layer on another surface of the molding compound opposite the one surface;
    forming a through hole through the first dielectric layer, the second dielectric layer, and the molding compound;
    drilling a via through the first dielectric layer connected to the die pad of the first die;
    electroless plating a first conductive layer over the first dielectric layer, the second dielectric layer, the through hole, and the via;
    attaching a resist film covering the electroless plated first conductive layer;
    patterning and exposing the resist film to form a pattern;
    plating a second conductive layer over the through hole, the via, and over the first conductive layer which are over the first dielectric layer and the second dielectric layer, based on the pattern of the resist film;
    removing the resist film; and
    etching the first conductive layer and the second conductive layer to remove the first conductive layer only from areas where the first conductive layer is plated.

15. The method of claim 14, further comprising assembling a build-up layer covering the second conductive layer.

16. The method of claim 14, further comprising:
    placing a second die with a second die pad on top of the peelable tape covering the base while the second die pad is in contact with the peelable tape;
    forming the molding compound on top of the peelable tape, the first die and the second die to encapsulate the first die and the second die, while separating the first die and the second die by the molding compound; and
    drilling a second via through the first dielectric layer connected to the second die pad.

17. The method of claim 16, further comprising attaching the die pads of the first and second dies to respective bumps of a third die.

18. The method of claim 14, the first and second dielectric layers each comprising a material selected from the group consisting of: build-up film, benzocyclo-buthene, liquid crystal polymer, poly-imide, bismaleimide triazine, and Aramide.

19. The method of claim 14, the first and second conductive layers each comprising a material selected from the group consisting of: copper, tin, nickel, chromium, titanium, a copper/chromium alloy, and a tin/lead alloy.

20. The method of claim 14, the first dielectric layer and the first conductive layer collectively, and the second dielectric layer and the second conductive layer collectively, each comprising resin coated copper.

* * * * *